(12) United States Patent
Van Adrichem et al.

(10) Patent No.: US 7,966,583 B2
(45) Date of Patent: Jun. 21, 2011

(54) METHOD AND APPARATUS FOR DETERMINING THE EFFECT OF PROCESS VARIATIONS

(75) Inventors: Paulus J. M. Van Adrichem, Wijchen (NL); Yunqiang Zhang, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 386 days.

(21) Appl. No.: 12/169,278

(22) Filed: Jul. 8, 2008

(65) Prior Publication Data
US 2010/0011325 A1    Jan. 14, 2010

(51) Int. Cl.
*G06F 17/50*    (2006.01)
*G06F 19/00*    (2006.01)
*G06K 9/00*    (2011.01)

(52) U.S. Cl. .............. 716/53; 716/51; 716/55; 382/149; 700/121

(58) Field of Classification Search ............... 716/50–55; 382/144–145, 149; 700/121
See application file for complete search history.

(56) References Cited

U.S. PATENT DOCUMENTS

| | | | |
|---|---|---|---|
| 6,513,151 B1 | 1/2003 | Erhardt et al. | |
| 7,747,978 B2 * | 6/2010 | Ye et al. | 716/21 |
| 2006/0051682 A1 * | 3/2006 | Hess et al. | 430/5 |
| 2006/0236294 A1 * | 10/2006 | Saidin et al. | 716/19 |
| 2007/0006116 A1 * | 1/2007 | Percin et al. | 716/21 |
| 2007/0050749 A1 | 3/2007 | Ye et al. | |
| 2007/0108368 A1 * | 5/2007 | Mieher et al. | 250/201.2 |
| 2007/0276634 A1 * | 11/2007 | Smith et al. | 703/1 |
| 2009/0187866 A1 * | 7/2009 | Ou et al. | 716/4 |
| 2010/0081068 A1 * | 4/2010 | Kim | 430/5 |
| 2010/0180251 A1 * | 7/2010 | Ye et al. | 716/19 |
| 2010/0229147 A1 * | 9/2010 | Ye et al. | 716/19 |

FOREIGN PATENT DOCUMENTS

| | | |
|---|---|---|
| EP | 0342881 A1 | 5/1989 |
| WO | 2005124293 A1 | 12/2005 |

OTHER PUBLICATIONS

Huynh, B. et al., "Calibrated Exposure and Focus Test Patterns for Characterization of Optical Projection Printing", Microelectronic Engineering 9 (1989), pp. 79-82.

* cited by examiner

*Primary Examiner* — Stacy A Whitmore
(74) *Attorney, Agent, or Firm* — Park, Vaughan, Fleming & Dowler LLP; Laxman Sahasrabuddhe

(57) ABSTRACT

Embodiments of the present invention provide systems and techniques for determining the effect of process variations. During operation, the system can receive a layout which includes multiple instances of a pattern. Next, the system can correct the pattern instances using different photolithography process models which model the photolithography process at different exposure and focus conditions. Next, the corrected layout can be printed on a wafer. The system can then perform electrical tests on the wafer, or it can measure the critical dimensions of the features on the wafer. The yield loss or the exposure-focus matrix can then be generated by using the test data or the measurement data.

20 Claims, 5 Drawing Sheets

METHOD AND APPARATUS FOR DETERMINING THE EFFECT OF PROCESS VARIATIONS

FIELD OF THE INVENTION

The present invention generally relates to electronic design automation. More specifically, the present invention relates to methods and apparatuses for determining the effect of process variations.

BACKGROUND

Related Art

Rapid advances in computing technology have made it possible to perform trillions of computational operations each second on data sets that are sometimes as large as trillions of bytes. These advances can be attributed to the dramatic improvements in semiconductor manufacturing technologies which have made it possible to integrate tens of millions of devices onto a single chip.

Process variations in semiconductor manufacturing technologies can cause the characteristics of the actual integrated circuit to be different from the desired characteristics. If this difference is too large, it can lead to manufacturing problems which can reduce the yield and/or reduce the performance of the integrated circuit.

Hence, it is desirable to determine the effect of process variations on the critical dimensions of features so that the amount of variation that can be tolerated can be determined.

SUMMARY

One embodiment of the present invention provides a system that determines the effect of process variations. The system creates a layout which contains multiple instances of a pattern. Next, the system corrects the different instances of the pattern by using photolithography process models which are calibrated using different process conditions. Specifically, the photolithography models can be calibrated using different exposure and focus conditions.

The corrected layout is then subjected to the photolithography process under nominal process conditions. Next, the system uses the printed features on the wafer to determine the effect of process variations.

In one embodiment, the layout patterns are for electrically testable structures, i.e., open/short or parametric tests can be performed on the printed patterns. The results of the electronic tests can be used to estimate the process window or to estimate the loss in the yield due to exposure and focus drift.

In another embodiment, the critical dimensions of the features on the wafer are measured physically (e.g., using a scanning electron microscope) or electrically. The system can then generate the exposure-focus matrix using the critical dimension measurements.

Note that the critical dimensions of the different pattern instances as printed on the wafer mimic the effect of different process conditions because the pattern instances were corrected using photolithography process models which were calibrated using different process conditions. In this manner, an embodiment of the present invention enables a user to determine the critical dimensions of features under different process conditions without actually printing the layout multiple times, and in doing so, reduces the amount of time and resources required to determine the effect of process variations.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
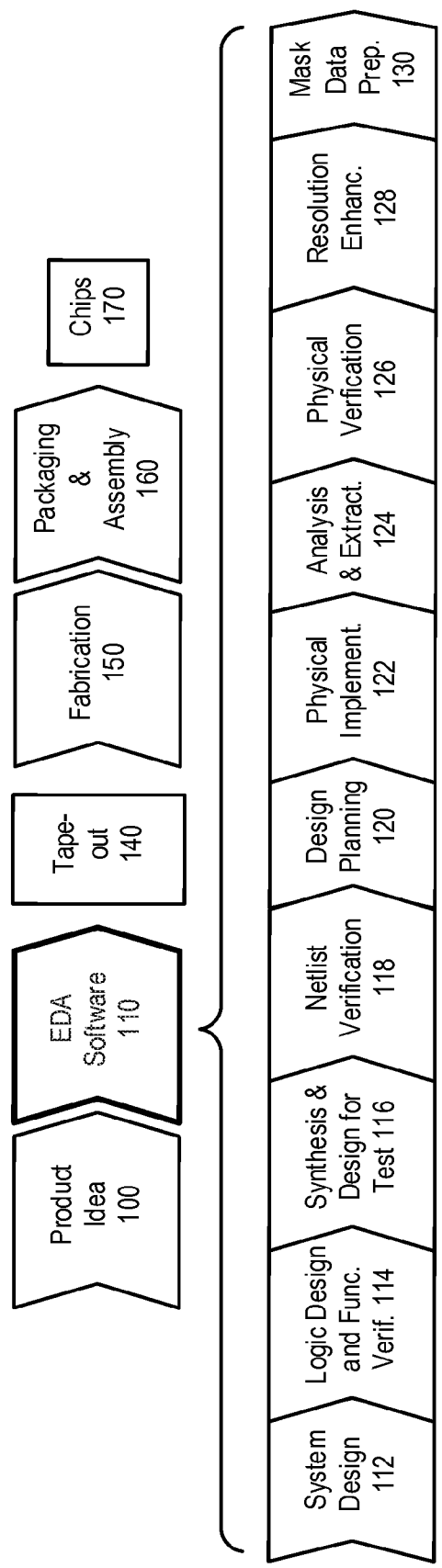
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process usually starts with a product idea (step 100) which is realized using an EDA process (step 110). Once the design is finalized, it is usually taped-out (event 140) and goes through the fabrication process (step 150) and packaging and assembly processes (step 160) to produce the finished chips (result 170).

The EDA process (step 110) comprises steps 112-130, which are described below for illustrative purposes only and are not meant to limit the present invention. For example, an actual integrated circuit design may require the designer to perform the design steps in a different sequence than the sequence described below.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber®, System Studio, and DesignWare®.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS®, Vera®, DesignWare®, Magellan™, Formality®, ESP and Leda®.

Synthesis and design for test (step 116): The VHDL/Verilog can be translated to a netlist in this stage. The netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare®.

Netlist verification (step 118): In this step, the netlist is checked for compliance with timing constraints and for correspondence with the VHDL/Verilog source code. Exemplary EDA software products from Synopsys, Inc. that can be used at this step include Formality®, PrimeTime®, and VCS®.

Design planning (step 120): Here, an overall floorplan for the chip is constructed and analyzed for timing and top-level routing. Exemplary EDA software products from Synopsys, Inc. that can be used at this step include Astro™ and IC Compiler products.

Physical implementation (step 122): The placement (positioning of circuit elements) and routing (connection of the same) occurs at this step. Exemplary EDA software products from Synopsys, Inc. that can be used at this step include the Astro™ and IC Compiler products.

Analysis and extraction (step 124): At this stage, the circuit function is verified at a transistor level; this, in turn, permits what-if refinement. Exemplary EDA software products from Synopsys, Inc. that can be used at this step include Astro-Rail™, PrimeRail, PrimeTime®, and Star-RCXT™.

Physical verification (step 126): In this step, the design is checked to ensure correctness for manufacturing, electrical issues, lithographic issues, and circuitry. Exemplary EDA software products from Synopsys, Inc. that can be used at this step include the Hercules™ product.

Resolution enhancement (step 128): This step involves geometric manipulations of the layout to improve manufacturability of the design. Exemplary EDA software products from Synopsys, Inc. that can be used at this step include Proteus/Progen, ProteusAF, and PSMGen.

Mask data preparation (step 130): This step provides the "tape-out" data for production of masks to produce finished chips. Exemplary EDA software products from Synopsys, Inc. that can be used at this step include the CATS® family of products.

Process Window

Process variations can arise due to a variety of reasons. For example, in photolithography, variations in the rotation speed of the spindle can cause the resist thickness to vary, which can cause variations in the reflectivity, which, in turn, can cause unwanted changes to the pattern's image. Similarly, exposure dose of the scanner can drift from its nominal setting, which can cause variations in the critical dimension (CD).

Process variations can cause the characteristics of the actual integrated circuit to be different from the desired characteristics. If this difference is too large, it can lead to manufacturing problems which can reduce the yield and/or reduce the performance of the integrated circuit.

Specifically, the critical dimensions of the features on a wafer must be within a given tolerance to ensure proper functioning of the integrated circuit. The process window of a semiconductor manufacturing process is the amount of process variation that can be tolerated without causing the critical dimensions of the features on the wafer to go beyond the acceptable range of values.

Process Models

A process model models the behavior of one or more semiconductor manufacturing processes which usually involve complex physical and chemical interactions. A process model can be determined by fitting or calibrating kernel coefficients to empirical data. The empirical data is usually generated by applying the semiconductor manufacturing processes that are being modeled to one or more test layouts. For example, a photolithography process can be used to print a test layout on a wafer. Next, the empirical data can be obtained by measuring the critical dimensions (CD) of the features. An uncalibrated process model can then be fit to the empirical data to obtain a calibrated process model that models the photolithography process.

Once a process model is determined, it can be used in a number of applications during the design and manufacture of a semiconductor chip. For example, process models are typically used to support optical proximity correction (OPC) and resolution enhancement technologies (RET). These models can allow full-chip database manipulation in reasonable timeframes during the tapeout flow.

An uncalibrated process model typically includes components that are associated with parameters and/or coefficients. During calibration, the parameters and/or coefficients can be statistically fit to empirical data to obtain the final process model. A component in the process model is typically a mathematical expression that is designed to model a particular physical effect. For example, a process model may be represented as $$\sum_i (c_i \cdot k_i),$$

where $k_i$ is a component or kernel, and $c_i$ is a coefficient which is associated with $k_i$. The empirical data may include values of a desired property, e.g., the CD, at different locations in the layout. Once the process model is fit to the empirical data, it can then be used to predict the value of the desired property for other layouts.

It may be impossible to calibrate coefficient values so that the predicted data exactly matches the empirical data. Even if an exact fit was available, it may not be desirable because the resulting process model may not interpolate and/or extrapolate properly. Typically, statistical fitting techniques are used to determine the parameters and/or coefficients so that the error between the empirical data and the predicted data is minimized. In one embodiment, the system can use a least squares fitting technique to determine the parameter and/or coefficient values.

A process model is considered to be robust if it interpolates and extrapolates well, i.e., if the process model generates accurate results when it is applied to layouts that are different from the layouts that were used during the fitting process. In general, the fewer modeling functions or kernels that a process model uses, the more robust it is. However, using fewer kernels may decrease the process model's accuracy. Hence, there is usually a tradeoff between the robustness and the accuracy of a process model.

Photolithography Process Models

The optical model in a photolithography process model is usually based on the Hopkins model which models the behavior of partially coherent optical systems.

Figure 2:
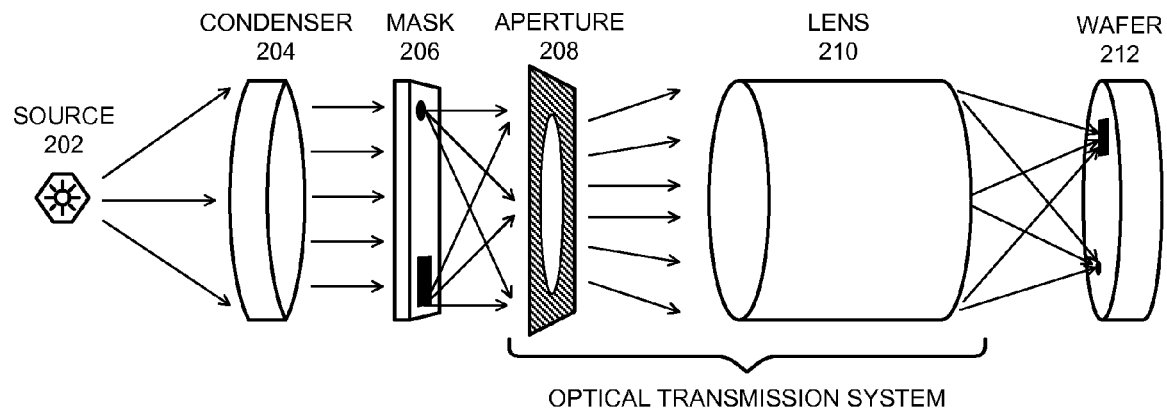
FIG. 2 illustrates a typical optical system in accordance with an embodiment of the present invention.

FIG. 2 illustrates a typical optical system in accordance with an embodiment of the present invention.

Radiation from source 202 can be collimated by a condenser 204. The collimated light can then pass through mask 206, aperture 208, lens body 210, and form an image on a wafer 212.

The Hopkins model can be described using the expression:

$$I(x,y) = \iiiint J(x',y';x'',y'') \otimes L(x,y;x',y') \otimes L^*(x,y;x'',y'') dx'dy'dx''dy'',$$

where, $I(x,y)$ is the optical intensity at point $(x,y)$ on the wafer, $L(x,y; x',y')$ is a lumped model of the light source and the mask, L* is the complex conjugate of L, and J(x',y'; x",y") models the incoherence between two points of light on the mask. The lumped model (L) essentially treats the mask as an array of light sources. In particular, L(x,y; x',y') models point (x',y') on the mask as a point source, and J(x',y'; x",y") models the incoherence between the light emanating from points (x',y') and (x",y") on the mask. The lumped model (L) can be represented as a convolution between the mask and the source. For example, the lumped model can be represented using a mask model and a source model as follows:

$$L(x,y;x',y')=M(x',y') \otimes K(x,y;x',y'),$$

where $M(x',y')$ models the mask and $K(x,y; x',y')$ models the source.

The Hopkins model can be used to determine a 4-D (four dimensional) matrix called the transmission cross coefficient (TCC) matrix which models the optical system. The TCC matrix can then be represented using a set of orthogonal 2-D (two dimensional) kernels. The set of orthogonal kernels can be determined using the eigenfunctions of the TCC matrix. The features on the wafer can be determined by convolving the set of 2-D kernels with the mask. General information on photolithography and process modeling can be found in Alfred Kwok-Kit Wong, *Optical Imaging in Projection Microlithography*, SPIE-International Society for Optical Engine, 2005, and Grant R. Fowles, *Introduction to Modern Optics*, 2$^{nd}$ Edition, Dover Publications, 1989.

In one embodiment, the system uses a set of orthogonal functions called Zernike polynomials to represent the optical system. Zernike polynomials are made up of terms that are of the same form as the types of aberrations often observed in optical systems. For example, one Zernike polynomial may be associated with defocus, while another may be associated with tilt, etc. The optical system can be represented using the expression $$\sum_i (c_i \cdot z_i),$$

where $z_i$ is a Zernike polynomial and $c_i$ is an optical coefficient which is associated with $z_i$.

The foregoing descriptions of a photolithography process model have been presented only for purposes of illustration and description. They are not intended to be exhaustive or to limit the present invention to the forms disclosed. Accordingly, many modifications and variations will be apparent to practitioners skilled in the art.

Specifically, the complexity of a photolithography process model can depend on the application in which the process model is going to be used. For example, if we want to perform a full-blown OPC on a layout that contains complex geometries, we may need a sophisticated process model that accurately models the photolithography process. On the other hand, if we simply want to model the effect of exposure and focus variations on a 1-D (one dimensional) feature, the process model can be as simple as a linear or a quadratic function that returns the critical dimension based on the exposure and focus values.

Exposure-Focus Matrix

In conventional techniques the process window of a photolithography process is determined using an exposure-focus matrix. In this technique, a layout is printed using a photolithography process under different process conditions. The critical dimensions are measured and associated with different process conditions to obtain the exposure-focus matrix.

Figure 3:
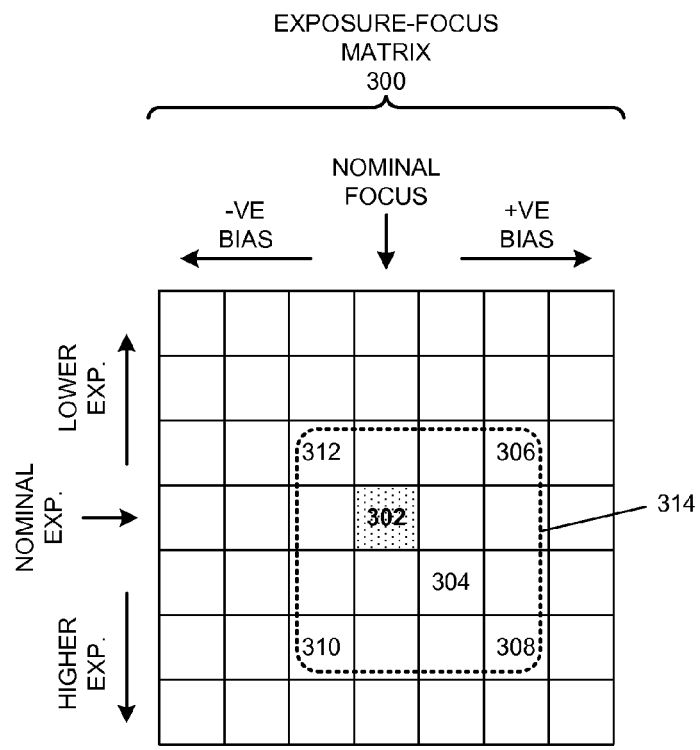
FIG. 3 illustrates an exposure-focus matrix in accordance with an embodiment of the present invention.

FIG. 3 illustrates an exposure-focus matrix in accordance with an embodiment of the present invention.

Each element in exposure-focus matrix 300 represents the critical dimension of a feature which is printed using a specific exposure and focus. For example, each row can correspond to a particular exposure, and each column can correspond to a particular focus.

One of the elements in the matrix typically corresponds to the critical dimension of the feature for nominal process conditions. For example, the center element, i.e., element 302, can be the critical dimension of a feature which was printed by the photolithography process at nominal exposure and focus conditions.

Other elements in the matrix can correspond to critical dimensions of the feature under process conditions which are different from nominal process conditions. For example, element 304 can be the critical dimension of the feature which corresponds to an exposure that is greater than the nominal exposure, and a focus that is positively biased (i.e., positive defocus) with respect to the nominal focus.

Exposure-focus matrix 300 can be used to determine the process window. Note that, as we move away from the center of the matrix, the critical dimension value is expected to become increasingly different from the critical dimension value at the center element. Specifically, a region around the center element will contain critical dimension values that are within the tolerance. The boundaries of this region represent the process window for the photolithography process.

For example, let elements 306, 308, 310, and 312 represent the boundary of region 314 in the matrix which contains critical dimension values that are within the tolerance. Elements that lie outside this region have critical dimension values that are not within the acceptable range of critical dimensions. For example, the difference between the critical dimension value in element 314 and the critical dimension value at element 302 (which corresponds to nominal process conditions) is greater than the maximum variation in critical dimension values that can be tolerated. The exposure and focus values that correspond to elements 306, 308, 310, and 312 represent the process window for the photolithography process.

In conventional techniques, the layout has to be printed multiple times under different process conditions. For example, to obtain the exposure-focus matrix 300, the layout would have to be printed 49 times, which is the number of elements in exposure-focus matrix 300. Printing a layout only once is itself a laborious task, let alone printing the layout multiple times. As a result, conventional techniques for determining an exposure-focus matrix typically require large amounts of time and resources. Hence, it is desirable to reduce the amount of time and resources required to determine the effect of process variations.

Determining the Effect of Process Variations

One embodiment of the present invention provides systems and techniques for determining the effect of process variations without expending large amounts of time and resources. Specifically, in contrast to conventional techniques which require the layout to be printed multiple times under different process conditions, an embodiment of the present invention enables a user to determine the effect of process variations (e.g., by determining an exposure-focus matrix) by printing the layout only once.

An embodiment of the present invention is based on the following insight: if we have multiple instances of a pattern in a layout, and if we modify the patterns to mimic the effect of exposure and focus variations, we can determine the effect of process variations by printing the layout only once. Specifically, different instances of the pattern can be corrected using a process model that is calibrated at process conditions that are different from the nominal process conditions.

Note that this insight is counter-intuitive because it uses different process models to correct different patterns on the same layout. Conventional techniques use the same process model (which is calibrated at nominal process conditions) to correct all the patterns in the layout because conventional techniques want to accurately predict the shape of the features on the wafer when the layout is printed at nominal process conditions. If a conventional technique corrected a pattern using a process model that is calibrated at process conditions that are different from nominal process conditions, the pattern will not print as desired, and the conventional technique will generate inaccurate results. Hence, conventional techniques require that we use the same process model to correct all patterns in the layout. In contrast, an embodiment of the present invention uses different process models to correct different patterns in the layout.

Figure 4:
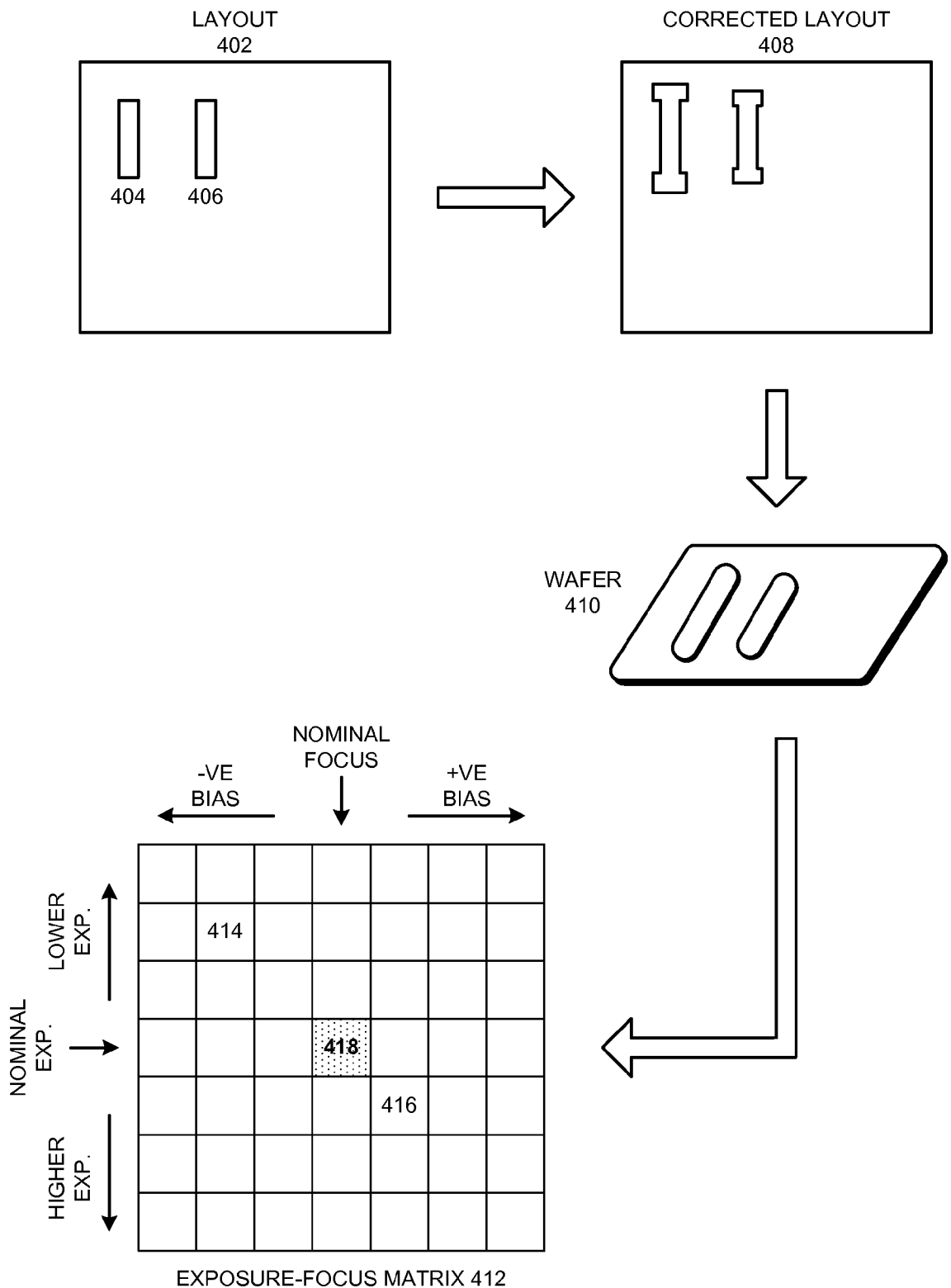
FIG. 4 illustrates how the effect of process variations can be determined by correcting multiple instances of a pattern using different process models in accordance with an embodiment of the present invention.

FIG. 4 illustrates how the effect of process variations can be determined by correcting multiple instances of a pattern using different process models in accordance with an embodiment of the present invention.

Layout 402 includes multiple instances of a pattern, such as pattern instances 404 and 406. Note that a layout would typically include many more instances of a pattern. For example, to determine a 7×7 exposure-focus matrix, the layout would include at least 49 instances of the pattern. However, for the sake of clarity, we have illustrated only two instances of the pattern in FIG. 4.

Pattern instance 404 can be corrected using a process model which is calibrated using an exposure which is greater than the nominal exposure and a focus that is positively biased relative to the nominal focus. On the other hand, pattern instance 406 can be corrected using a process model which is calibrated using an exposure which is less than the nominal exposure and a focus that is negatively biased relative to the nominal focus.

The corrected pattern instances are illustrated in corrected layout 408. Once the corrected layout is printed to obtain wafer 410, electrical tests can be performed on the printed structures to determine the effect of process variations.

Alternatively, the critical dimensions of features on wafer 410 can be measured using a scanning electron microscope. These critical dimension measurements can then be used to determine an exposure-focus matrix. For example, critical dimensions of features on wafer 410 can be used to create exposure-focus matrix 412. Element 414 in exposure-focus matrix 412 contains the CD measurement of pattern instance 404, element 416 in exposure-focus matrix 412 contains the CD measurement of pattern instance 406, and element 418 relates to the CD measurement of yet another pattern instance (not shown in FIG. 4) at nominal exposure and focus conditions.

Note that the exposure and focus conditions associated with an element in the matrix are the "opposite" of the exposure and focus conditions for which the process model was calibrated. For example, pattern instance 404 is corrected using a process model which is calibrated to an exposure which is greater than the nominal exposure and a focus that is positively biased relative to the nominal focus. Hence, element 414 in exposure-focus matrix 412 (which contains the CD measurement of pattern instance 404) is associated with an exposure which is less than the nominal exposure and a focus that is negatively biased relative to the nominal focus. This is because, relative to the process point at which the process model was calibrated, the nominal process conditions have a lower exposure and have a focus which is negatively biased. Similarly, element 416 in exposure-focus matrix 412 (which contains the CD measurement of pattern instance 406) is associated with an exposure which is greater than the nominal exposure and a focus that is positively biased relative to the nominal focus.

Process for Determining the Effect of Process Variations

Figure 5:
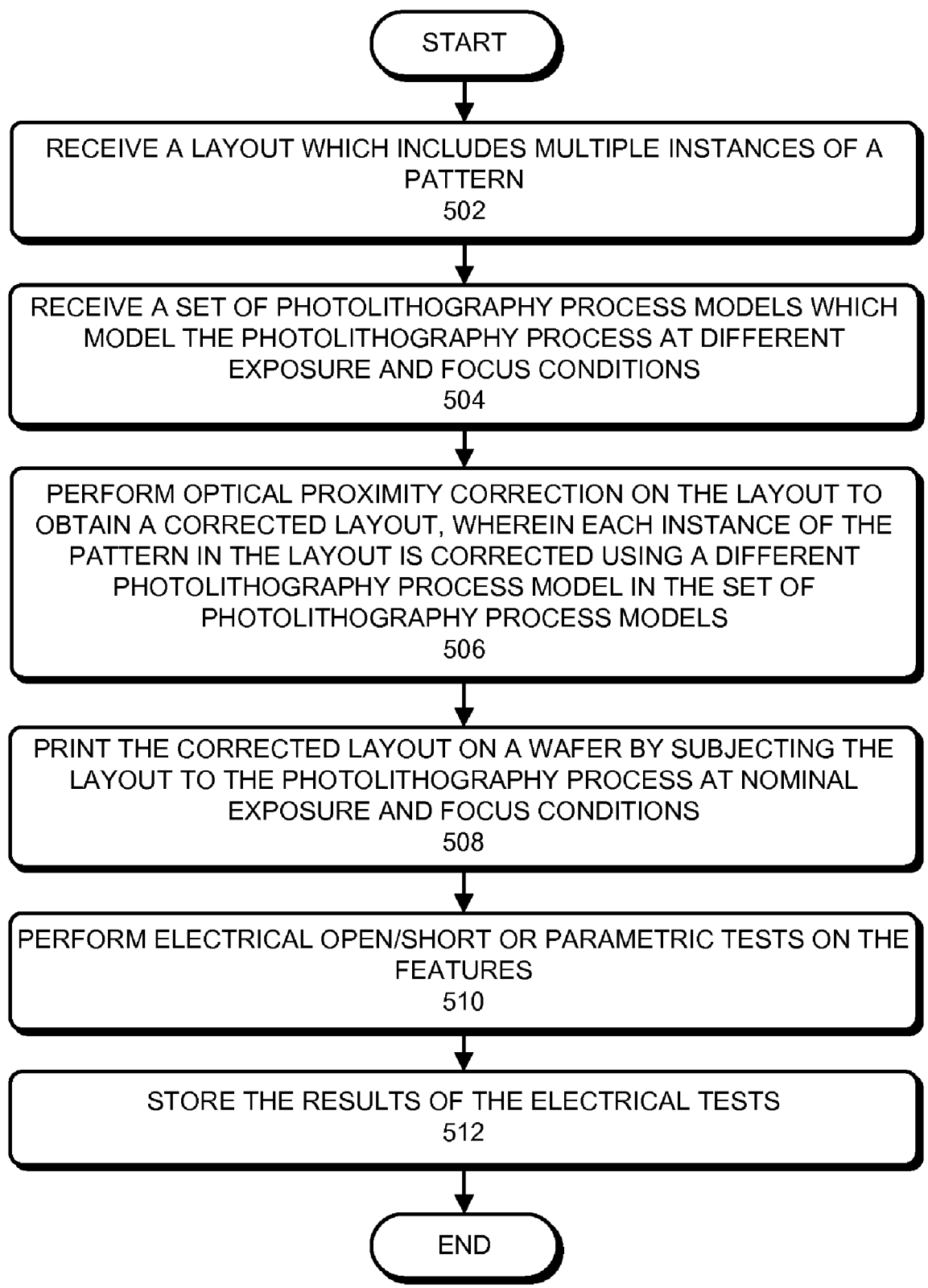
FIG. 5 presents a flowchart that illustrates a process for determining the effect of process variations in accordance with an embodiment of the present invention.

FIG. 5 presents a flowchart that illustrates a process for determining the effect of process variations in accordance with an embodiment of the present invention.

The process can begin by receiving a layout which includes multiple instances of a pattern (step 502). In one embodiment, the pattern instances are electrically testable structures. For example, at nominal process conditions, the pattern instance may be expected to print features on the wafer which are electrically coupled. However, if the process conditions are different from the nominal process conditions, it may cause the critical dimensions of the features to change, which may cause the features to no longer be electrically coupled. In this manner, we can determine the effect of process variations by performing electrical open/short tests or parametric tests on the features.

Next, the system can receive a set of photolithography process models which model the photolithography process at different exposure and focus conditions (step 504).

The set of photolithography process models can be determined by calibrating an uncalibrated process model using process data that is generated by subjecting a test layout to the photolithography process at different exposure and focus conditions. Specifically, the system can receive a test layout for calibrating the uncalibrated photolithography process model. Next, the system can print the test layout on a test wafer by subjecting the test layout to the photolithography process under a specific exposure and focus condition. The system can then generate process data by measuring critical dimensions of test features on the test wafer. Next, the system fit the uncalibrated process model to the process data.

The system can then perform optical proximity correction on the layout to obtain a corrected layout, wherein each instance of the pattern in the layout is corrected using a different photolithography process model in the set of photolithography process models (step 506).

Next, the system can print the corrected layout on a wafer by subjecting the layout to the photolithography process at nominal exposure and focus conditions (step 508).

The system can then use the features on the wafer to determine the effect of process variations. Specifically, the system can perform electrical open/short or parametric tests on the features (step 510).

Next, the system can store the results of the electrical tests (step 512). The test results can then be used to determine the effect of process variations.

Alternatively, the system can measure critical dimensions of features on the wafer which are associated with the instances of the pattern. Next, the system can determine the exposure-focus matrix for the photolithography process by associating the measured critical dimensions of the features on the wafer with the different exposure and focus conditions which were associated with the set of photolithography process models.

Specifically, if an instance of the pattern is corrected using a photolithography process model which is calibrated using an exposure that is less than the nominal exposure, the corresponding critical dimension data can be associated with an exposure that is greater than the nominal exposure. On the other hand, if an instance of the pattern is corrected using a photolithography process model that is calibrated using an exposure that is greater than the nominal exposure, the corresponding critical dimension data is associated with an exposure that is less than the nominal exposure.

Similarly, if an instance of the pattern is corrected using a photolithography process model that is calibrated using a focus that is positively biased with respect to the nominal focus, the corresponding critical dimension data is associated with a focus that is negatively biased with respect to the nominal focus. On the other hand, if an instance of the pattern is corrected using a photolithography process model that is calibrated using a focus that is negatively biased with respect to the nominal focus, the corresponding critical dimension data is associated with a focus that is positively biased with respect to the nominal focus. Once the exposure-focus matrix has been determined, the system can then store the exposure-focus matrix.

Figure 6:
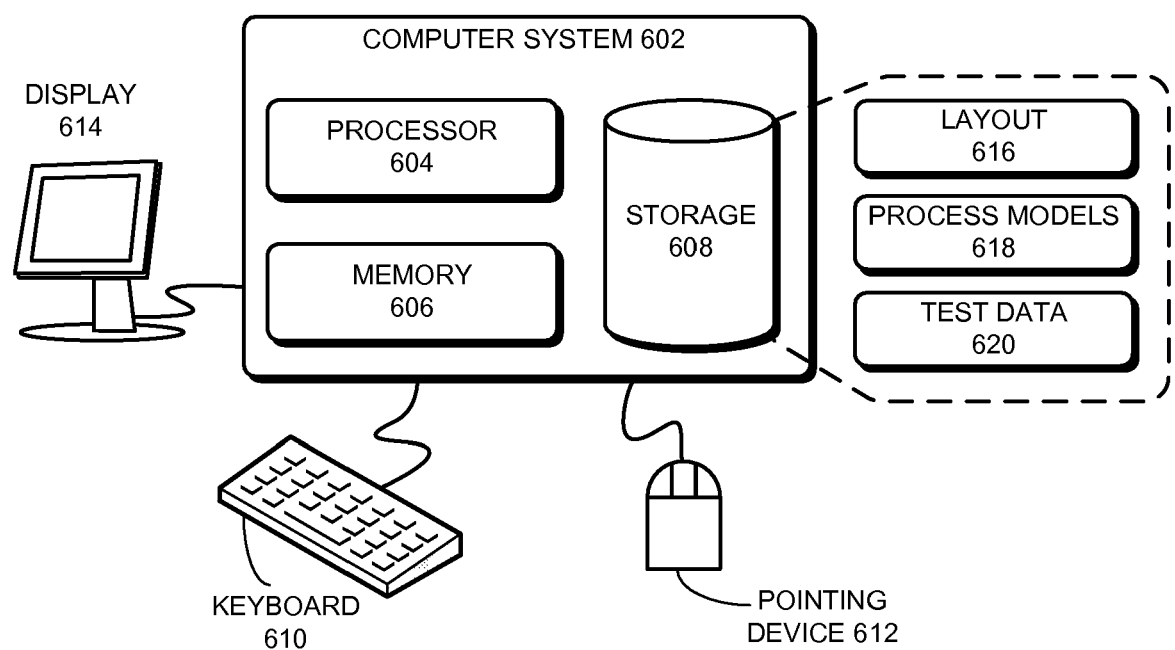
FIG. 6 illustrates a computer system which can be used to determine an exposure-focus matrix in accordance with an embodiment of the present invention.

FIG. 6 illustrates a computer system which can be used to determine an exposure-focus matrix in accordance with an embodiment of the present invention.

Computer system 602 comprises processor 604 (which can include one or more cores), memory 606, and storage device 608. Computer system 602 can be coupled with display 614, keyboard 610, and pointing device 612. Storage device 608 can store layout 616, process models 618, and test data 620. In one embodiment, computer system 602 can include a multi-processor system.

During operation, computer system 602 can load layout 616 and process models 618 into memory 606. A user can then use process models 618 to generate a corrected layout. Next, the layout can be printed using the photolithography process at nominal process conditions, and once printed, electrical tests can be performed or the critical dimensions of the resulting features can be measured. The user can then store the test data 620 on storage 608, and use the test data to determine the loss in yield or to determine the exposure-focus matrix.

CONCLUSION

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining an effect of process variation, the method comprising:
receiving a layout which includes multiple instances of a pattern, wherein the pattern is designed to be electrically testable when printed;
receiving a set of photolithography process models which model the photolithography process under different exposure and focus conditions;
performing optical proximity correction on a first instance and a second instance of the pattern in the layout to obtain a corrected layout, wherein the first instance and the second instance of the pattern in the layout are corrected using different photolithography process models in the set of photolithography process models;
printing the corrected layout on a single wafer by subjecting the corrected layout to a single application of the photolithography process;
performing electrical tests on features on the wafer, wherein the features are associated with the instances of the pattern; and
storing results of the electrical tests, wherein the results of the electrical tests correspond to the photolithography process being operated under different exposure and focus conditions.

2. The method of claim 1, further comprising:
measuring critical dimensions of the features; and
determining the exposure-focus matrix for the photolithography process by associating the measured critical dimensions of the features with the different exposure and focus conditions which were associated with the set of photolithography process models.

3. The method of claim 2,
wherein when an instance of the pattern is corrected using a photolithography process model which is calibrated using an exposure that is less than the nominal exposure, the corresponding critical dimension data is associated with an exposure that is greater than the nominal exposure;
wherein when an instance of the pattern is corrected using a photolithography process model that is calibrated using an exposure that is greater than the nominal exposure, the corresponding critical dimension data is associated with an exposure that is less than the nominal exposure;
wherein when an instance of the pattern is corrected using a photolithography process model that is calibrated using a focus that is positively biased with respect to the nominal focus, the corresponding critical dimension data is associated with a focus that is negatively biased with respect to the nominal focus; and
wherein when an instance of the pattern is corrected using a photolithography process model that is calibrated using a focus that is negatively biased with respect to the nominal focus, the corresponding critical dimension data is associated with a focus that is positively biased with respect to the nominal focus.

4. The method of claim 1, wherein the set of photolithography process models is determined by calibrating an uncalibrated process model using process data that is generated by subjecting a test layout to the photolithography process under different exposure and focus conditions.

5. The method of claim 4, wherein calibrating the uncalibrated process model includes:
receiving a test layout for calibrating the uncalibrated photolithography process model;
printing the test layout on a test wafer by subjecting the test layout to the photolithography process under a specific exposure and focus condition;
generating process data by measuring critical dimensions of test features on the test wafer; and
fitting the uncalibrated process model to the process data.

6. The method of claim 1, wherein performing the electrical tests includes:
performing an electrical open/short test; or
performing a electrical parametric test.

7. The method of claim 1, wherein the results of the electrical tests are used to estimate yield loss.

8. A non-transitory computer-readable storage medium storing instructions that when executed by a computer cause the computer to perform a method for determining an effect of process variation, the method comprising:
receiving a layout which includes multiple instances of a pattern, wherein the pattern is designed to be electrically testable when printed;
receiving a set of photolithography process models which model the photolithography process under different exposure and focus conditions;
performing optical proximity correction on a first instance and a second instance of the pattern in the layout to obtain a corrected layout, wherein the first instance and the second instance of the pattern in the layout are corrected using different photolithography process models in the set of photolithography process models;
printing the corrected layout on a single wafer by subjecting the corrected layout to a single application of the photolithography process;
performing electrical tests on features on the wafer, wherein the features are associated with the instances of the pattern; and
storing results of the electrical tests, wherein the results of the electrical tests correspond to the photolithography process being operated under different exposure and focus conditions.

9. The non-transitory computer-readable storage medium of claim 8, the method further comprising:
measuring critical dimensions of the features; and
determining the exposure-focus matrix for the photolithography process by associating the measured critical dimensions of the features with the different exposure and focus conditions which were associated with the set of photolithography process models.

10. The non-transitory computer-readable storage medium of claim 9,
wherein when an instance of the pattern is corrected using a photolithography process model which is calibrated using an exposure that is less than the nominal exposure, the corresponding critical dimension data is associated with an exposure that is greater than the nominal exposure;
wherein when an instance of the pattern is corrected using a photolithography process model that is calibrated using an exposure that is greater than the nominal exposure, the corresponding critical dimension data is associated with an exposure that is less than the nominal exposure;
wherein when an instance of the pattern is corrected using a photolithography process model that is calibrated using a focus that is positively biased with respect to the nominal focus, the corresponding critical dimension data is associated with a focus that is negatively biased with respect to the nominal focus; and
wherein when an instance of the pattern is corrected using a photolithography process model that is calibrated using a focus that is negatively biased with respect to the nominal focus, the corresponding critical dimension data is associated with a focus that is positively biased with respect to the nominal focus.

11. The non-transitory computer-readable storage medium of claim 8, wherein the set of photolithography process models is determined by calibrating an uncalibrated process model using process data that is generated by subjecting a test layout to the photolithography process under different exposure and focus conditions.

12. The non-transitory computer-readable storage medium of claim 11, wherein calibrating the uncalibrated process model includes:
receiving a test layout for calibrating the uncalibrated photolithography process model;
printing the test layout on a test wafer by subjecting the test layout to the photolithography process under a specific exposure and focus condition;
generating process data by measuring critical dimensions of test features on the test wafer; and
fitting the uncalibrated process model to the process data.

13. The non-transitory computer-readable storage medium of claim 8, wherein performing the electrical tests includes:
performing an electrical open/short test; or
performing a electrical parametric test.

14. The non-transitory computer-readable storage medium of claim 8, wherein the results of the electrical tests are used to estimate yield loss.

15. An apparatus for determining an exposure-focus matrix for a photolithography process, the apparatus comprising:
a processor; and
a computer-readable storage medium storing instructions that when executed by the processor cause the apparatus to:
receive a layout which includes multiple instances of a pattern, wherein the pattern is designed to be electrically testable when printed;
receive a set of photolithography process models which model the photolithography process under different exposure and focus conditions;
perform optical proximity correction on a first instance and a second instance of the pattern in the layout to obtain a corrected layout, wherein the first instance and the second instance of the pattern in the layout are corrected using different photolithography process models in the set of photolithography process models;
print the corrected layout on a single wafer by subjecting the corrected layout to a single application of the photolithography process;
perform electrical tests on features on the wafer, wherein the features are associated with the instances of the pattern; and
store results of the electrical tests, wherein the results of the electrical tests correspond to the photolithography process being operated under different exposure and focus conditions.

16. The apparatus of claim 1, wherein the computer-readable storage medium stores instructions that when executed by the processor cause the apparatus to:

measure critical dimensions of the features; and determine the exposure-focus matrix for the photolithography process by associating the measured critical dimensions of the features with the different exposure and focus conditions which were associated with the set of photolithography process models.

17. The apparatus of claim 16, wherein when an instance of the pattern is corrected using a photolithography process model which is calibrated using an exposure that is less than the nominal exposure, the corresponding critical dimension data is associated with an exposure that is greater than the nominal exposure;

wherein when an instance of the pattern is corrected using a photolithography process model that is calibrated using an exposure that is greater than the nominal exposure, the corresponding critical dimension data is associated with an exposure that is less than the nominal exposure;

wherein when an instance of the pattern is corrected using a photolithography process model that is calibrated using a focus that is positively biased with respect to the nominal focus, the corresponding critical dimension data is associated with a focus that is negatively biased with respect to the nominal focus; and wherein when an instance of the pattern is corrected using a photolithography process model that is calibrated using a focus that is negatively biased with respect to the nominal focus, the corresponding critical dimension data is associated with a focus that is positively biased with respect to the nominal focus.

18. The apparatus of claim 15, wherein the set of photolithography process models is determined by calibrating an uncalibrated process model using process data that is generated by subjecting a test layout to the photolithography process under different exposure and focus conditions.

19. The apparatus of claim 18, wherein calibrating the uncalibrated process model includes:

receiving a test layout for calibrating the uncalibrated photolithography process model;

printing the test layout on a test wafer by subjecting the test layout to the photolithography process under a specific exposure and focus condition;

generating process data by measuring critical dimensions of test features on the test wafer; and fitting the uncalibrated process model to the process data.

20. The method of claim 15, wherein the results of the electrical tests are used to estimate yield loss.

\* \* \* \* \*